United States Patent [19]
Suzuki

[11] Patent Number: 5,904,558
[45] Date of Patent: May 18, 1999

[54] FABRICATION PROCESS OF SEMICONDUCTOR DEVICE

[75] Inventor: Mieko Suzuki, Tokyo, Japan

[73] Assignee: NEC Corporation, Tokyo, Japan

[21] Appl. No.: 08/799,829

[22] Filed: Feb. 13, 1997

[30] Foreign Application Priority Data

Feb. 16, 1996 [JP] Japan .................................. 8-28893

[51] Int. Cl.⁶ .................................................. H01L 21/44
[52] U.S. Cl. ........................... 438/633; 438/692; 438/699
[58] Field of Search .................................... 438/638, 624, 438/688, 692, 699

[56] References Cited

U.S. PATENT DOCUMENTS

| | | | |
|---|---|---|---|
| 5,494,854 | 2/1996 | Jain | 438/763 |
| 5,629,242 | 5/1997 | Nagashima et al. | 438/692 |

FOREIGN PATENT DOCUMENTS

| | | |
|---|---|---|
| 64-41244 | 2/1989 | Japan . |
| 3-295239 | 12/1991 | Japan . |
| 6-310504 | 11/1994 | Japan . |
| 7-297193 | 11/1995 | Japan . |
| 8-255791 | 10/1996 | Japan . |

*Primary Examiner*—Caridad Everhart
*Attorney, Agent, or Firm*—Foley & Lardner

[57] ABSTRACT

A semiconductor device is formed with an interlayer insulation layer having its high flatness. A metal wiring is formed on a silicon substrate via a silicon oxide layer. A multi-layer silicon oxide layer that is to be the interlayer insulation film is formed over the insulation layer and the metal wiring. The multi-layer silicon layer consists of an upper most first silicon oxide layer, a lower most third silicon oxide layer and an intermediate second silicon oxide layer. The second silicon oxide layer has higher polishing rate than the first and third silicon oxide layer. By performing chemical mechanical polishing for the multilayer silicon oxide layer, a step formed by the presence of the metal layer can be satisfactorily eliminated fox planarizing the surface of the interlayer insulation film.

20 Claims, 4 Drawing Sheets

FABRICATION PROCESS OF SEMICONDUCTOR DEVICE

BACKGROUND OF THE INVENTION

1. Field of the Invention

The present invention relates generally to a fabrication process of a semiconductor device. More specifically, the invention relates to a planarization technology in a semiconductor integrated circuit device.

2. Description of the Related Art

On a semiconductor substrate various elements, such as isolation layer, a stacked capacitor, metal wiring and so forth, are formed to form a large step. When a photolithographic method in a condition where the step is maintained, the focusing margin becomes small to cause lowering of pattern precision. Furthermore, due to decreasing of step coverage of a deposited metal layer, breakage of wiring can be caused easily. Therefore, in the prior art, various surface planarization technologies, such as glass flowing method, SOG Spin on Glassy method, etching back method, CMP (Chemical Mechanical Polishing) method and so forth, are implemented. Among these methods, attention has been attracted to the CMP method for the capability of obtaining global flatness.

FIGS. 3A to 3C are sections showing planarization technology disclosed in D. Webb, et al., "Complete Intermetal Planarization Using ECR Oxide and Chemical Mechanical Polish" 1992, VMIC Conference Proceeding, pp. 141–148

As show in FIG. 3A, an aluminum wiring 3 is formed on al semiconductor substrate 1 via a silicon oxide layer 2. Next, as show in FIG. 3B, a silicon oxide to be an interlayer insulation film 31 is deposited by an ECR system CVD (Chemical Vapor Deposition) method. Subsequently, as shown in FIG. 3C, the surface is planarized by polishing with the CMP method thereinafter referred to as "first prior art").

On the other hand, Japanese Unexamined Patent Publication (Kokai) No. Heisei 3-295239 proposes a method in which the SOG technology and polishing method are employed in combination as shown in FIGS. 4A to 4C (hereinafter referred to as "second prior art).

At first, as show in FIG. 4A, the aluminum wiring 3 is formed in a layer thickness of 1 $\mu$m on the semiconductor substrate 1 via the silicon oxide layer 2. A PSG layer 41 to be the interlayer insulation film is deposited in the thickness of 0.8 $\mu$m thereover.

Next, as shown in FIG. 4B, a SOG layer 42 to be a buried layer is spin coated. Then, heat treatment is performed at a temperature of 400° to 450° C. for 30 minutes. Subsequently, as shown in FIG. 4C, polishing of the surface is performed employing hydrofluoric acid of 0.5 to 1.0% for planarization. At this time, by adjusting water content in the SOG layer, polishing speed of the SOG layer is set higher than polishing speed of the PSG layer.

In the first prior art, since the interlayer insulation film is formed by one kind of material, when a region formed as a wide wiring to be a projecting portion (hereinafter referred to as "wide area firing region") is polished, a flat portion is also polished simultaneously. Therefore, when polishing is continued, an absolute "step" 32 remains as shown in FIG. 3C, that makes it difficult to obtain global flatness.

On the other hand, in the second prior art, if polishing is initiated from the condition shown in FIG. 4B, polishing in the wide area wiring region that is as the projecting portion is progressed earlier, so that the SOG on the wire wiring is polished out earlier. Subsequently, the SOG is polished in the flat portion (wiring concentrated portion) and the PSG is polished in the wide area wiring region. However, since the polishing speed of the SOG is higher than that of the PSG, the SOG is polished out except for the recessed portion. This condition is similar to the polishing condition of the first prior art. Therefore, even when polishing is continued in this condition, the absolute step cannot be eliminated.

SUMMARY OF THE INVENTION

The present invention has been worked out for solving the drawbacks in the prior art set forth above. Therefore, it is an object of the present invention to obtain a quite flat surface while eliminating an absolute step upon planarization by polishing (CMP) an interlayer insulation film formed on the surface having a step.

In order to accomplish the above-mentioned object, a fabrication process of a semiconductor device comprises:

first step of forming a metal wiring on a semiconductor substrate having an active element, via an insulation layer;

second step of depositing a first silicon oxide layer on the insulation layer with the metal wiring;

third step of depositing a second silicon oxide layer over the first silicon oxide layer, the second silicon oxide layer having higher polishing speed than the first silicon oxide layer;

fourth step of depositing a third silicon oxide layer over the second silicon oxide layer, the third silicon oxide layer having lower polishing speed than the second silicon oxide layer; and fifth step of performing chemical mechanical polishing of the third, second and first silicon oxide layers for forming an interlayer insulation film with planarized surface.

Preferably, deposition of silicon oxide layer in the second to fourth steps is performed by one of electron cyclotron resonance type chemical vapor deposition method, other plasma chemical vapor deposition method and sputtering.

It is also preferred for gaining high efficiency of deposition that the second to fourth steps are performed sequentially within the same deposition system with varying deposition condition. In the preferred process, the layer thickness respective of the silicon oxide layers deposited in the third and fourth steps are set so that, at a timing where the first silicon oxide layer comes to be exposed in a region having a surface at a higher position, a part of the third silicon oxide layer remains in a region having a surface at a lower position.

The polishing speed of the first silicon oxide layer may be lower than the polishing speed of the third silicon oxide layer. To achieve this, the second silicon oxide layer may have a lower density than the first and third silicon oxide layers. In such case, the first silicon oxide layer may have a higher density than the third silicon oxide layer.

In practice, the second to fourth steps may be performed by electron cyclotron resonance type chemical vapor deposition under the presence Of $O_2$ and $SiH_4$, wherein a reaction gas used in the third step has a flow rate ratio $O_2/SiH_4$ greater than reaction gases used in the second and fourth steps. More specifically, for example the flow rate ratio $O_2/SiH_4$ used in the second and fourth steps may be 1.5 and the flow rate of $O_2/SiH_4$ used in the third step may be 0.8.

In the alternative, the second and fourth steps may be performed by applying a high frequency power, and the third step is performed by applying a high frequency power and a low frequency power.

In the above specific example, the metal wiring may be aluminum layer in a thickness of 0.8 μm, the first silicon oxide layer may be in a range greater than or equal to 0.8 μm and less than or equal to 1.5 μm, the second silicon oxide layer may be in a range greater than or equal to 0.3 μm and less than or equal to 0.8 μm, and the third silicon oxide layer may be in a range greater than or equal to 0.2 μm and less than or equal to 9.5 μm.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding.

In the drawings.

DESCRIPTION OF THE PREFERRED EMBODIMENT

The present invention will be discussed hereinafter, in detail, in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. Also, well-known structures are not shown in detail in order to avoid unnecessarily obscuring the present invention.

First Embodiment

Figure 1A:
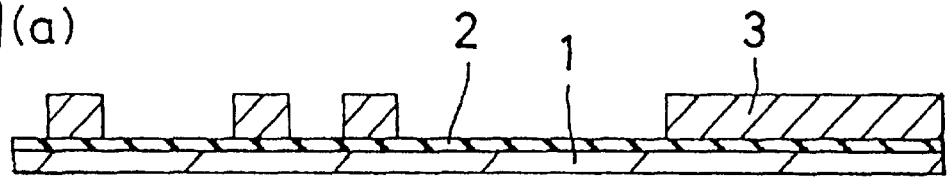
FIGS. 1A to 1D are sections showing process steps of the first embodiment of a fabrication process of a semiconductor device according to the present invention, illustrated in order of process steps.

FIGS 1A to 1D are sections showing process steps in order for explaining the first embodiment of a fabrication process of a semiconductor device according to the present invention. At first, as shown in FIG. 1A, on a semiconductor substrate 1 in which a diffusion layer is already formed, a silicon oxide layer 2 is deposited by a CVD method in a thickness of 0.5 μm. Subsequently, aluminum is deposited in a layer thickness of 0.8 μm. The aluminum layer thus deposited is then patterned to form an aluminum wiring 3.

Figure 1B:
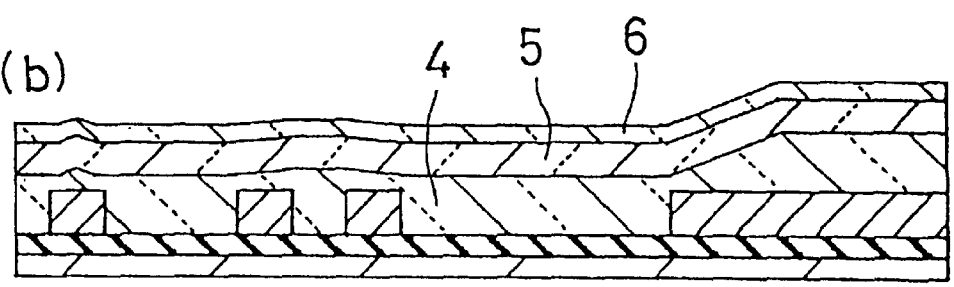

Next, as shown in FIG. 1B, by way of the ECR system CVD method, a first silicon oxide layer 4 is formed by depositing $SiO_2$ in a layer thickness of 1.1 μm by supplying oxygen and silicon hydride under the condition of in a flow rate ratio: $O_2/SiH_4=1.5$, $SiH_4$ flow rate: 30 sccm. Subsequently, by way of the ECR system CVD method, a second silicon oxide layer 5 is formed by depositing $SiO_2$ in a layer thickness of 0.6 μm under the condition of a flow rate ratio : $O_2/SiH_4=0.8$, $SiH_4$ flow rate: 50 sccm. Furthermore, by way of the ECR plasma CVD method, a third silicon oxide layer 6 is formed by depositing $SiO_2$ in a layer thickness of 0.3 μm under the condition of in a flow rate ratio: $O_2/SiH_4=1.5$, $SiH_4$ flow rate: 50 sccm.

Figure 1C:
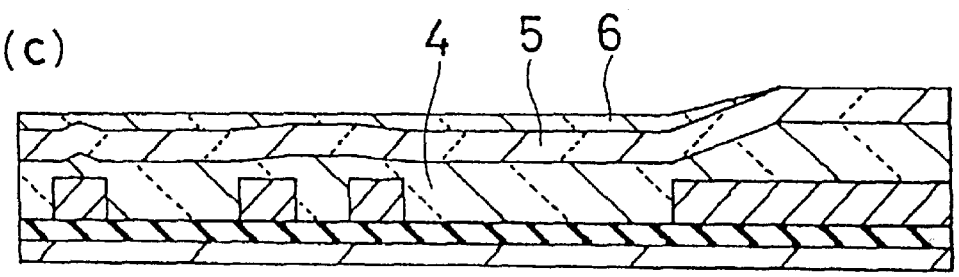
Figure 1D:
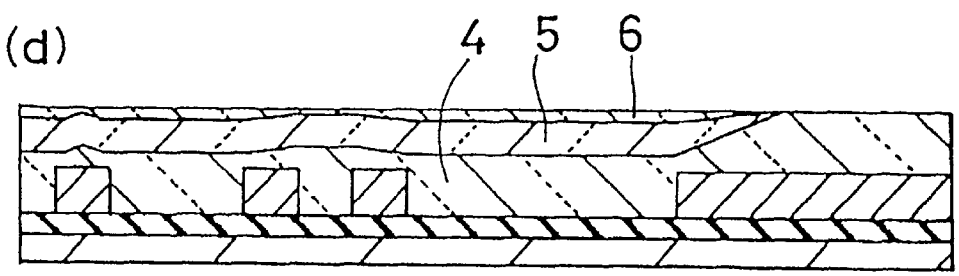

Next, as shown in FIG. 1C, a chemical mechanical polishing is performed employing the CMP method for planarization. At this time, the slurry used is an alkaline slurry having a pH value greater than or equal to 1.0.

Upon deposition of $SiO_2$ by the ECR plasma CVD method using $O_2/SiH_4$ as the reaction gas, the silicon oxide layer deposited under a condition of the flow rate ratio: $O_2/SiH_4=0.8$, is a more silicon rich layer than that deposited under the condition of the flow rate ratio: $O_2/SiH_4=1.5$. Therefore, in polishing the using alkaline slurry, the polishing speed becomes high. In contrast to this, the silicon oxide layer deposited under the condition of the flow rate ratio: $O_2/SiH_4=1.5$, has low Si content and is a high density layer. Thus, polishing speed becomes low, so as to be approximately half of that of the silicon oxide layer deposited under the condition of flow rate ratio: $O_2/SiH_4=0.8$.

When CMP is performed after deposition of the silicon oxide layers 4 to 6 under the foregoing condition as shown in FIG. 1B, since the polishing speed in the projecting portion is higher than the remaining portion, the third silicon oxide layer 6 in the wide area wiring region is polished out at first as shown in FIG. 1C. Continuing polishing, since the surface height of the side area wiring region is still higher than remaining portion and the second silicon oxide layer 5, having higher polishing speed than the third silicon oxide layer 6 is enclosed on the surface, the silicon oxide layer in the wide area wiring region is polished at a much higher speed than the remaining portion to abruptly reduce the step height. Accordingly, by appropriately setting the condition of deposition of the silicon oxide layers and the layer thickness of respective silicon oxide layers, the absolute step can be substantially eliminated.

While the first and third silicon oxide layers are deposited at the same flow rate ratio $O_2/SiH_4$, the first silicon oxide layer is deposited under a lower flow rate of the reaction gas. In such case, the first silicon oxide layer has higher density than that of the third silicon oxide layer and thus has a lower polishing speed than the latter. Providing a polishing speed difference between the first and third silicon oxide layer achieves the following advantage. That is, during further polishing from the condition show in FIG. 1C and when the second silicon oxide layer is polished out in the wide area wiring region at the surface height lower than that of the remaining portion, the polishing speed of the third silicon oxide layer 6 in the concentrated wiring portion becomes higher than that in the wider area wiring portion in subsequent polishing for reducing step height.

In the shown embodiment, example of FIG. 1 when the layer thickness of the aluminum wiring 3 is 0.8 μm, the preferred layer thickness of the first silicon oxide layer is greater than or equal to 0.8 μm and less than or equal to 1.5 μm, of the second silicon oxide later is greater than or equal to 0.3 μm and less than or equal to 0.8 μm, and of the third silicon oxide layer is greater than or equal to 0.2 μm and lass than or equal to 0.5 μm.

Second Embodiment

Figure 2A:
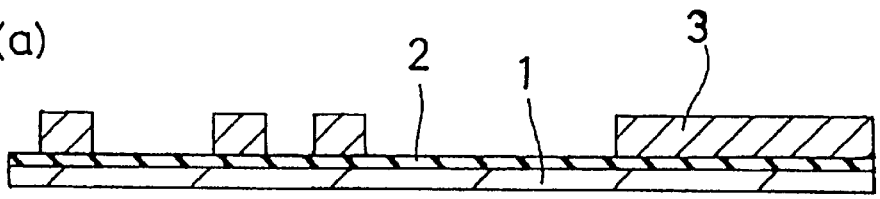
FIGS. 2A to 2D are sections showing process steps of the second embodiment of a fabrication process of a semiconductor device according to the present invention, illustrated in order of process steps.

Discussion will be given for the second embodiment of the fabrication process of the semiconductor device according to the invention with reference to FIGS. 2A to 2D. At first, as shown in FIG. 2A, on the silicon substrata 1, for which a diffusion layer has already been formed, the silicon oxide layer 2 is formed in a thickness of 0.5 μm by the CVD method, and the aluminum wiring 3 as lower layer wiring is formed in a thickness of 0.8 μm.

Figure 2B:
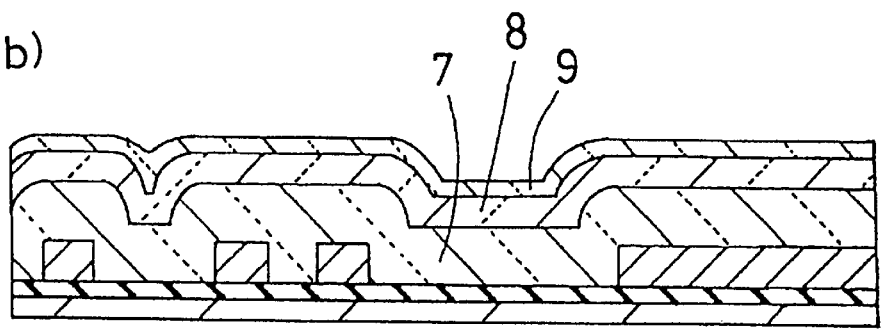

Next, as shown in FIG. 2B, by employing a diode parallel plate plasma enhanced CVD system, and supplying $SiH_4$—$N_2O$ as a reaction gas, a first silicon oxide layer 7 is foxed in a layer thickness of 1.1 μm under the condition of high frequency/low frequency power: 600/400 (W). Subsequently, employing the same CVD system, a second silicon oxide layer 8 is formed in a layer thickness of 0.6 μm under the condition of high frequency/low frequency power: 1000/0 (W). Also, employing the same CVD system, a third silicon oxide layer 9 is formed in a layer thickness of 0.3 μm under the condition of high frequency/low frequency power: 600/400 (N).

Figure 2C:
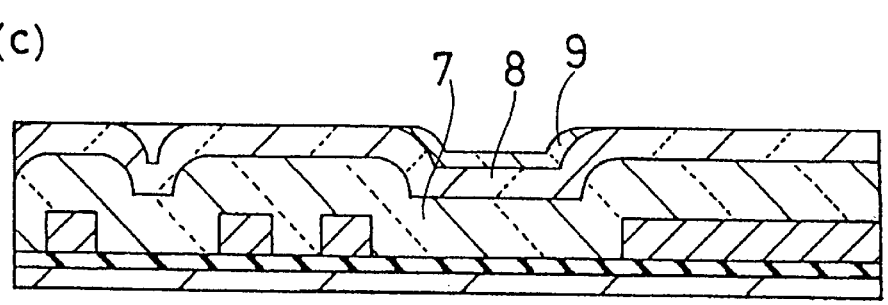

Next, as shown in FIG. 2C, the chemical mechanical polishing is performed by employing the method for planarization. The slurry used in chemical mechanical polishing is an alkaline slurry having a pH value greater than or equal to 1.0.

The plasma CVD silicon oxide layer formed under the condition of high frequency/low frequency power: 1000/0 (W), has a low density and thus has a high polishing speed. In contrast to this, the plasma CVD silicon oxide layer formed under the condition of high frequency/low frequency power: 600/400 (W), has a high density and thus has a low polishing speed, so as to be about half of the polishing speed of the plasma CVD silicon oxide layer formed under the condition of high frequency/low frequency power: 1000/0 (W).

Figure 2D:
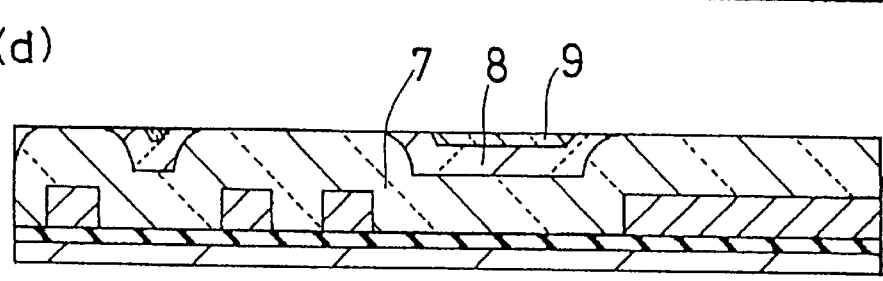
Figure 3A:
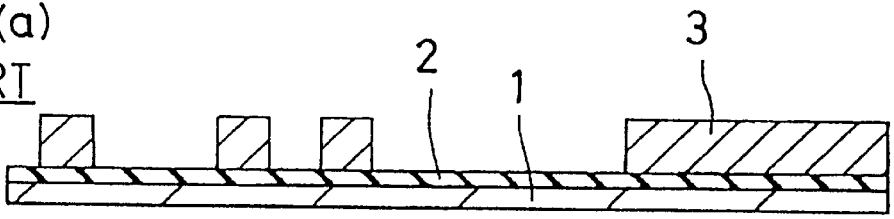
FIGS. 3A to 3C are sections showing process steps of the first prior art: illustrated in order of the process steps.
Figure 3B:
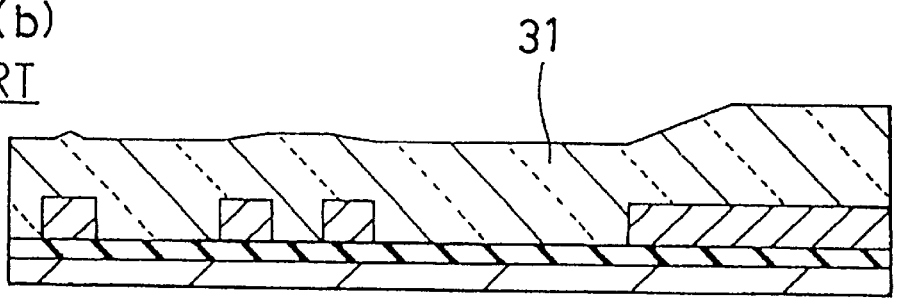
Figure 3C:
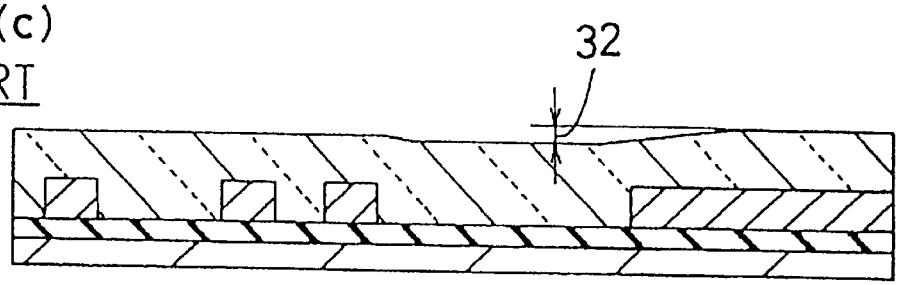
Figure 4A:
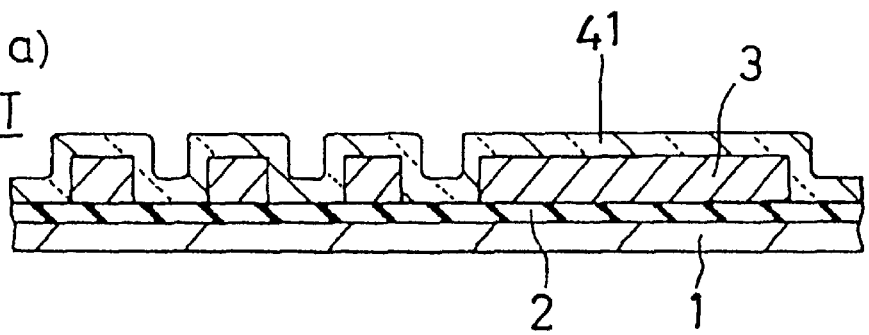
FIGS. 4A to 4C are sections showing process steps of the second prior art illustrated in order of the process steps.
Figure 4B:
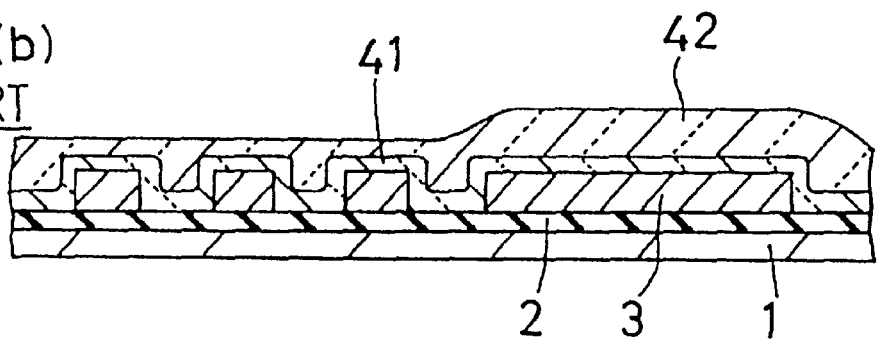
Figure 4C:
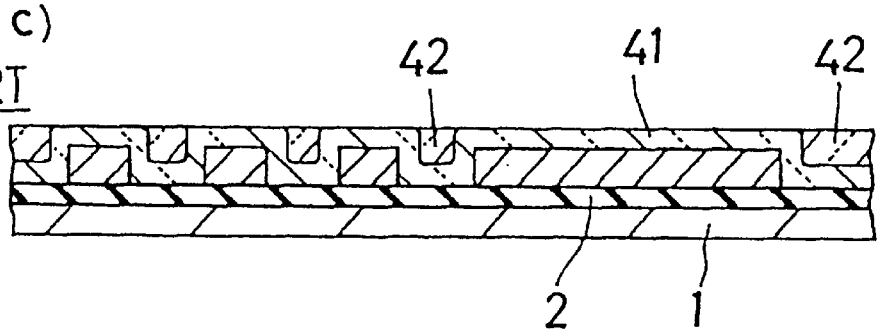

When CMP is performed after deposition of the silicon oxide layers 7 to 9 under the foregoing condition as shown in FIG. 2B, since the polishing speed in the projecting portion is higher than the remaining portion, the third silicon oxide layer 9 in the wiring region is polished out at first as shown in FIG. 2C. Continuing polishing, since the surface height of the wiring region is still higher than remaining portion and the second silicon oxide layer 8, having higher polishing speed than the third silicon oxide layer 9, is now exposed on the surface, the silicon oxide layer 8 in the wiring region is polished at a much higher speed than the remaining portion to abruptly reduce the step height. Accordingly, by appropriately setting the condition of deposition of the silicon oxide layers and the layer thickness of respective silicon oxide layers, the absolute step can be substantially eliminated as shown in FIG. 2D.

In the shown embodiment, example of FIG. 2 when the layer thickness of the aluminum wiring 3 is 0.8 μm, the preferred layer thickness of the first silicon oxide layer is greater than or equal to 0.8 μm and less than or equal to 1.5 μm, of the second silicon oxide later is greater than or equal to 0.3 μm and less than or equal to 0.8 μm, and of the third silicon oxide layer is greater than or equal to 0.2 μm and less than or equal to 0.5 μm.

After formation of the planarized interlayer insulation film by the first or second embodiment as set forth above, a through hole is formed and an upper layer aluminum Wiring is formed. In photolithographic technology for forming the through hole and the upper layer aluminum wiring, a photoresist layer can now be formed with a uniform layer thickness. Therefore, it becomes possible to adapt to a shallow focal depth associated with increased resolution. Thus, the upper layer wiring can be formed easily with high precision in the extent of ±0.1 μm.

As set forth above, in the fabrication process of the semiconductor device according to the present invention, the silicon oxide layer is formed in a three layer structure including an intermediate layer having a higher polishing speed, and polishing by way of the CMP method is performed for such silicon oxide layer. In the CMP method, the polishing speed in the projecting portion is higher than that in the flat portion. Therefore, when polishing is performed for the silicon oxide layer of a three layer structure having layers with a low polishing speed as upper and lower layers with respect to the intermediate layer, after polishing out the upper layer having the low polishing speed, the intermediate upper layer having a high polishing speed in the projecting portion is polished. During this period, since the layer having low polishing speed is present in the flat portion, the magnitude of polishing in the flat portion is little. Thus, due to difference of the polishing speed, the absolute step between the projecting portion and the flat portion can be abruptly reduced. Thus, the interlayer insulation film with the surface having a quite high flatness can be formed while substantially eliminating the absolute step.

Although the invention has been illustrates and described with respect to exemplary embodiment thereof, it should be understood by those skilled in the art that the foregoing and various other changes, omissions and additions my be made therein and thereto, without departing from the spirit and scope of the present invention. Therefore, the present invention should not be understood as limited to the specific embodiments set out above but to include all possible embodiments which can be embodied within a scope encompassed, and equivalents thereof, with respect to the feature set out in the appended claims.

For instance, while discussion has been given with respect to a process for depositing the silicon oxide layer by a ECR plasma CVD method, plasma CVD method and so forth in the foregoing embodiments, the silicon oxide layer may be deposited even by thermal CVD method, atmospheric pressure CVD method and sputtering in the present invention. Also, it is possible to form the interlayer insulation film by combining the silicon oxide layers formed by different deposition methods. It is further possible to contain impurity, such as phosphorus (P), boron (B) or so forth in the silicon oxide. In the present invention, it is preferred that the silicon oxide layers are deposited sequentially by employing the same deposition system with a varying deposition condition, in order to efficiently perform the deposition. Also, in the foregoing embodiment, aluminum is employed as the material for the wiring. However, similar effect may be obtained by employing aluminum alloy (aluminum-silicon-copper or so forth), titanium alloy (titanium nitride, titanium-tungsten and so forth as a replacement for aluminum.

What is claimed is:

1. A fabrication process of a semiconductor device comprising:
   a first step of forming a metal wiring on an insulation layer of a semiconductor substrate;
   a second step of depositing a first layer consisting essentially of silicon oxide over said insulation layer and said metal wiring;
   a third step of depositing a second layer consisting essentially of silicon oxide over said first silicon oxide layer, said second silicon oxide layer having a higher polishing speed than said first silicon oxide layer;
   a fourth step of depositing a third layer consisting essentially of silicon oxide over said second silicon oxide layer, said third silicon oxide layer having a lower polishing speed than said second silicon oxide layer; and
   a fifth step of performing a chemical mechanical polishing of said third, second and first silicon oxide layers for forming an interlayer insulation film with a planarized surface.

2. A fabrication process of a semiconductor device as set forth in claim 1, wherein deposition of said first, second, and third silicon oxide layers in said second to fourth steps is performed by at least one of an electron cyclotron resonance type chemical vapor deposition method, a plasma chemical vapor deposition method; and a sputtering method.

3. A fabrication process of a semiconductor device as set forth in claim 1, wherein said second to fourth steps are performed sequentially within the same deposition system with a varying deposition condition.

4. A fabrication process of a semiconductor device as set forth in claim 1, wherein a layer thickness respective of the silicon oxide layers deposited in said third and fourth steps are set so that, at a timing where said first silicon oxide layer comes to be exposed in a region having a surface at a higher position, a part of said third silicon oxide layer remains in a region having a surface at a lower position.

5. A fabrication process of a semiconductor device as sat forth in claim 1, wherein the polishing speed of said first silicon oxide layer is lower than the polishing speed of said third silicon oxide layer.

6. A fabrication process of a semiconductor device as sat forth in claim 1, wherein said second silicon oxide layer has a lower density than said first and third silicon oxide layers.

7. A fabrication process of a semiconductor device as sat forth in claim 6, wherein said first silicon oxide layer has a higher density than said third silicon oxide layer.

8. A fabrication process of a semiconductor device as set forth in claim 7, wherein said second to fourth steps are performed by an electron cyclotron resonance type chemical vapor deposition under presence of $O_2$ and $SiH_4$, wherein a reaction gas used in said third step has a flow rate ratio $O_2/SiH_4$ greater than a flow rate of a reaction gas used in either of said second and fourth steps.

9. A fabrication process of a semiconductor device as set forth in claim 8, wherein said flow rate ratio $O_2/SiH_4$ used in said second and fourth steps is 1.5 and said flow rate of $O_2/SiH_4$ used in said third step is 0.8.

10. A fabrication process of a semiconductor device as set forth in claim 7, wherein said second and fourth steps are performed by applying a high frequency power, and said third step is performed by applying a high frequency power and a low frequency power.

11. A fabrication process of a semiconductor device as set forth in claim 1, wherein said metal wiring is an aluminum layer having a thickness of 0.8 $\mu$m, said first silicon oxide layer having a thickness in a range greater than or equal to 0.8 $\mu$m and less than or equal to 1.5 $\mu$m, said second silicon oxide layer having a thickness in a range greater than or equal to 0.3 $\mu$m and less than or equal to 0.8 $\mu$m, and said third silicon oxide layer having a thickness in a range greater than or equal to 0.2 $\mu$m and less than or equal to 9.5 $\mu$m.

12. A fabrication process of a semiconductor device comprising:

a first step of forming a metal wiring on an insulation layer of a semiconductor substrate;

a second step of depositing a first silicon oxide layer over said insulation layer and said metal wiring;

a third step of depositing a second silicon oxide layer over said first silicon oxide layer;

a fourth step of depositing a third silicon oxide layer over said second silicon oxide layer, wherein said second to fourth steps are performed by a chemical vapor deposition, wherein a reaction gas used in said third step has a flow rate ratio greater than a flow rate of a reaction gas used in either of said second and fourth steps so as to cause said second silicon oxide layer to have a higher polishing speed than said first and third layers; and a fifth step of performing a chemical mechanical polishing of said third, second and first silicon oxide layers for forming an interlayer insulation film with a planarized surface.

13. A fabrication process of a semiconductor device as set forth in claim 12, wherein said second to fourth steps are performed sequentially within the same deposition system with a varying deposition condition.

14. A fabrication process of a semiconductor device as set forth in claim 12, wherein a layer thickness respective of the silicon oxide layers deposited in said third and fourth steps are set so that, at a timing where said first silicon oxide layer comes to be exposed in a region having a surface at a higher position, a part of said third silicon oxide layer remains in a region having a surface at a lower position.

15. A fabrication process of a semiconductor device as set forth in claim 12, wherein the polishing speed of said first silicon oxide layer is lower than the polishing speed of said third silicon oxide layer.

16. A fabrication process of a semiconductor device as set forth in claim 12, wherein said second silicon oxide layer has a lower density than said first and third silicon oxide layers.

17. A fabrication process of a semiconductor device as set forth in claim 16, wherein said first silicon oxide layer has higher density than said third silicon oxide layer.

18. A fabrication process of a semiconductor device as set forth in claim 12, wherein said second to fourth steps are performed by an electron cyclotron resonance type chemical vapor deposition under presence of $O_2$ and $SiH_4$, wherein said reaction gas used in said third step has a flow rate ratio $O_2/SiH_4$ greater than a flow rate of said reaction gas used in either of said second and fourth steps.

19. A fabrication process of a semiconductor device as set forth in claim 18, wherein said flow rate ratio $O_2/SiH_4$ used in said second and fourth steps is 1.5 and said flow rate of $O_2/SiH_4$ used in said third step is 0.8.

20. A fabrication process of a semiconductor device as set forth in claim 1, wherein said metal wiring is an aluminum layer having a thickness of 0.8 $\mu$m, said first silicon oxide layer having a thickness in a range greater than or equal to 0.8 $\mu$m and less than or equal to 1.5 $\mu$m, said second silicon oxide layer having a thickness in a range greater than or equal to 0.3 $\mu$m and less than or equal to 0.8 $\mu$m, and said third silicon oxide layer having a thickness in a range greater than or equal to 0.2 $\mu$m and less than or equal to 9.5 $\mu$m.

* * * * *